(12) United States Patent
Rodriguez et al.

(10) Patent No.: US 10,535,588 B2
(45) Date of Patent: Jan. 14, 2020

(54) DIE WITH METALLIZED SIDEWALL AND METHOD OF MANUFACTURING

(71) Applicant: STMicroelectronics, Inc., Calamba (PH)

(72) Inventors: Rennier Rodriguez, Bulacan (PH); Aiza Marie Agudon, Calamba (PH); Jefferson Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 30 days.

(21) Appl. No.: 15/408,979

(22) Filed: Jan. 18, 2017

(65) Prior Publication Data

US 2018/0204786 A1     Jul. 19, 2018

(51) Int. Cl.
*H01L 23/495*        (2006.01)
*H01L 21/683*        (2006.01)
(Continued)

(52) U.S. Cl.
CPC ...... *H01L 23/49513* (2013.01); *H01L 21/302* (2013.01); *H01L 21/306* (2013.01); *H01L 21/3043* (2013.01); *H01L 21/3065* (2013.01); *H01L 21/6836* (2013.01); *H01L 21/78* (2013.01); *H01L 23/564* (2013.01); *H01L 23/585* (2013.01); *H01L 24/26* (2013.01); *H01L 24/29* (2013.01); *H01L 24/32* (2013.01); *H01L 24/48* (2013.01); *H01L 24/73* (2013.01);
(Continued)

(58) Field of Classification Search
CPC ............. H01L 23/49513; H01L 33/20; H01L 29/0657; H01L 21/302; H01L 21/3043; H01L 21/306; H01L 21/3065
See application file for complete search history.

(56) References Cited

U.S. PATENT DOCUMENTS 6,583,512 B2 *  6/2003  Nakaoka ............... H01L 21/561
                                                              257/666
7,446,344 B2 * 11/2008  Fehrer .................... H01L 33/20
                                                               257/95
(Continued)

OTHER PUBLICATIONS

Roxhed, N. et al., "A Method for Tapered Deep Reactive ION Etching Using a Modified Bosch Process," Journal of Micromechanics and Microengineering, 17 (2007) 1087-1092, IOP Publishing Ltd., downloaded Jul. 12, 2016 from iopscience.iop.org.

*Primary Examiner* — Zandra V Smith
*Assistant Examiner* — Abbigale A Boyle
(74) *Attorney, Agent, or Firm* — Seed IP Law Group LLP

(57) ABSTRACT

The present disclosure is directed to a die having a metallized sidewall and methods of manufacturing the same. A contiguous metal layer is applied to each edge of a backside of a wafer. The wafer is cut at a base of a plurality of channels formed in the backside to create individual die each having a flange that is part of a sidewall of the die and includes a portion that is covered by the metal layer. When an individual die is coupled to a die pad, a semiconductive glue bonds the metal layer on the sidewall and a backside of the die to the die pad, which decreases the risk of delamination along the sides of the die. The flange also prevents the glue from contacting the active side of the die by acting as a barrier against adhesive creep of the glue up the sidewall of the die.

19 Claims, 7 Drawing Sheets

(51) Int. Cl.
*H01L 21/304* (2006.01)
*H01L 21/3065* (2006.01)
*H01L 23/00* (2006.01)
*H01L 23/58* (2006.01)
*H01L 21/78* (2006.01)
*H01L 29/06* (2006.01)
*H01L 33/20* (2010.01)
*H01L 21/302* (2006.01)
*H01L 21/306* (2006.01)

(52) U.S. Cl.
CPC .......... *H01L 29/0657* (2013.01); *H01L 33/20* (2013.01); *H01L 2221/6834* (2013.01); *H01L 2221/68327* (2013.01); *H01L 2224/26122* (2013.01); *H01L 2224/29198* (2013.01); *H01L 2224/32245* (2013.01); *H01L 2224/32503* (2013.01); *H01L 2224/48245* (2013.01); *H01L 2224/73265* (2013.01)

(56) References Cited

U.S. PATENT DOCUMENTS

| | | | |
|---|---|---|---|
| 7,691,726 B2* | 4/2010 | Seng | H01L 24/83 257/730 |
| 2014/0138833 A1* | 5/2014 | Seng | H01L 29/0657 257/751 |
| 2015/0249133 A1* | 9/2015 | Yanase | H01L 24/83 257/77 |
| 2016/0254160 A1* | 9/2016 | Kashiwazaki | H01L 21/302 257/620 |

* cited by examiner

DIE WITH METALLIZED SIDEWALL AND METHOD OF MANUFACTURING

BACKGROUND

Technical Field

The present disclosure is directed to a die having a backside and portions of a sidewall covered by a contiguous metal layer in order to improve adhesion between the die and a sintered semiconductive glue.

Description of the Related Art

Production of semiconductor packages often begins with production of a silicon wafer having an active side and a backside. A plurality of dies is formed on the active side through various processes. The wafer is then cut into individual die, and each die is coupled to a die pad on its backside using a die adhesive between the die backside and the die pad with the active side coupled to various electronic signal lines and voltage terminals. An encapsulant is then used to cover the combined die and die pad to create a semiconductor package. When attaching the die to the die pad, the use of a sintering process to create an intermetallic bond between a semiconductor glue and the die pad can provide superior electrical and thermal characteristics over die attach film or standard glues. However, the sintering process creates two significant problems in the final semiconductor package.

First, when the sintering process is used, the glue does not adhere to the silicon material that comprises the semiconductor die. As a result, the continual expansion and contraction of the die as it heats and cools during use creates separation, or delamination, between the glue and the die itself. This may cause the entire package to start to delaminate or it may allow impurities, such as moisture or ambient gases, to more quickly reach the active side of the die. Once impurities reach the active side of the die, they can short the active side, which renders the die useless. Second, adhesive creep of the glue up the sides of the die can allow the glue to reach the active side of the die, which again prevents the die from performing its intended electrical functions and therefore kills the die.

In an attempt to solve the first problem, some wafer backsides are coated with a metal layer before the wafer is separated into individual die, as can be appreciated from FIGS. 1-3.

As shown in FIG. 1, a wafer 20 includes a plurality of dies 22 formed on a wafer active side 21. The plurality of dies 22 are arranged on the wafer active side 21 with cutting lines 24 to allow the plurality of dies 22 to be separated from the wafer 21 without damaging the plurality of dies 22.

FIG. 2 shows a cross section of the wafer 20 along the line A-A of FIG. 1. Before the wafer 20 is separated into the plurality of dies 22, a metal layer 26 is applied to the wafer backside 23. Then, to prepare the wafer 20 for processing, a tape 28 is attached to the metal layer 26 on the wafer backside 23. The location of the scribe lines on the die that provide a guide to cut the combined dies 22, metal layer 26 and tape 28 are shown as dashed lines 24 in FIG. 2.

FIG. 3 depicts a typical cutting process of the wafer 20 using a blade 30. The blade 30 cuts through the scribe lines to remove a kerf 32 as shown by the cutting lines 24. The blade 30 also cuts completely through the wafer 20, the metal layer 26 and the tape 28 in order to form individual die 31. Another option for singulating the die from the wafer is through etching. See Niclas Roxhed, Patrick Griss and Goran Stemme, "A Method For Tapered Deep Reactive Ion Etching Using A Modified Bosch Process", 17 J. Micromech. Microeng. 1087-92 (2007). This etching process can include creating a chamfered edge in the silicon material that comprises most dies. The material lost in the cutting process is the kerf 32 that is directly below the scribe lines that corresponds to the width of blade 30. Once the wafer 20 is cut into individual die 31, the tape 28 is removed from the die and the metal layer 26 is coupled to a die pad using a sintering process with a specific type of semiconductor glue.

Unfortunately, the metal layer 26 does not extend to the sidewalls 35 of each individual die. As can be seen in FIG. 3, the sidewalls 35 are bare semiconductor material. As such, either there is no adhesion or adhesion is poor between the sintered semiconductor glue and the sides of the die 31, which increases delamination and allows impurities to more quickly reach the active side of the die in the semiconductor package. In addition, the sides 35 of the die are flat and they do not assist in preventing adhesive creep of the semiconductor glue, which can also short the die 31 if the semiconductor glue reaches the top of the die 31.

BRIEF SUMMARY

The present disclosure is directed to a die with a metallized sidewall to increase bonding between a sintered semiconductive glue and the die. In one embodiment, the die has a flange adjacent to an active side of the die. The flange is part of a sidewall of the die that extends from the die active side to the die backside. A metal layer is formed on the die backside and a portion of the die sidewall prior to the adhesion to the die pad.

When the die is coupled to a die pad with a semiconductive glue, the metal layer on the sidewall of the die increases adhesion between the sintered glue and the die. This increased adhesion prevents delamination from occurring along the sides of the die as the die pad expands and contracts due to the heat generated during use. Additional adhesion also provides an intermediate buffer layer between the die and the package. The sintered adhesion layer has a thermal coefficient of expansion that is between that of the die pad and the semiconductor die and the molding compound material. Generally, the metal die pad has the highest thermal coefficient of expansion and the molding compound has the lowest, with the die having one that is between them. The sintered adhesion layer will have a thermal coefficient of expansion that is between that of the die and of the metal, thus providing an expansion and contraction buffer between the sidewall of the die and the molding material, with acts to further prevent the delamination process.

In addition, the flange acts as a barrier against adhesive creep of the glue up the sidewall of the die. When the die is coupled to the die pad, cohesive forces between the glue and the sidewall allow the glue to creep up the sidewall and towards the active side of the die. By providing a flange that extends from the sidewall of the die, the flange acts as a block to limit the cohesive forces, because the glue must turn a first corner, then a second corner to pass over the flange, which aids to prevent the glue from reaching the active side.

The present disclosure is also directed to a method of manufacturing a die having a metallized sidewall. In one exemplary embodiment, a plurality of channels is formed in a backside of a wafer using a mechanical blade, a laser, or an etching process. Then, the wafer backside and exposed edge of the plurality of channels are metallized before a wafer tape is attached to the metal layer on the wafer backside, and the wafer is separated at a base of each channel into singulated die. The singulated die are coupled to a die pad with a sintered semiconductive glue and wires are attached between the die and leads. The resulting combination is encapsulated with a molding compound to form a semiconductor package.

In alternative exemplary embodiments, a wafer tape can be placed on the wafer active side before the plurality of channels is formed in the wafer backside. The additional support from the wafer tape allows the channels to extend further into a body of the die and increase the amount of metal on the sidewall of the die in order to further increase adhesion.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
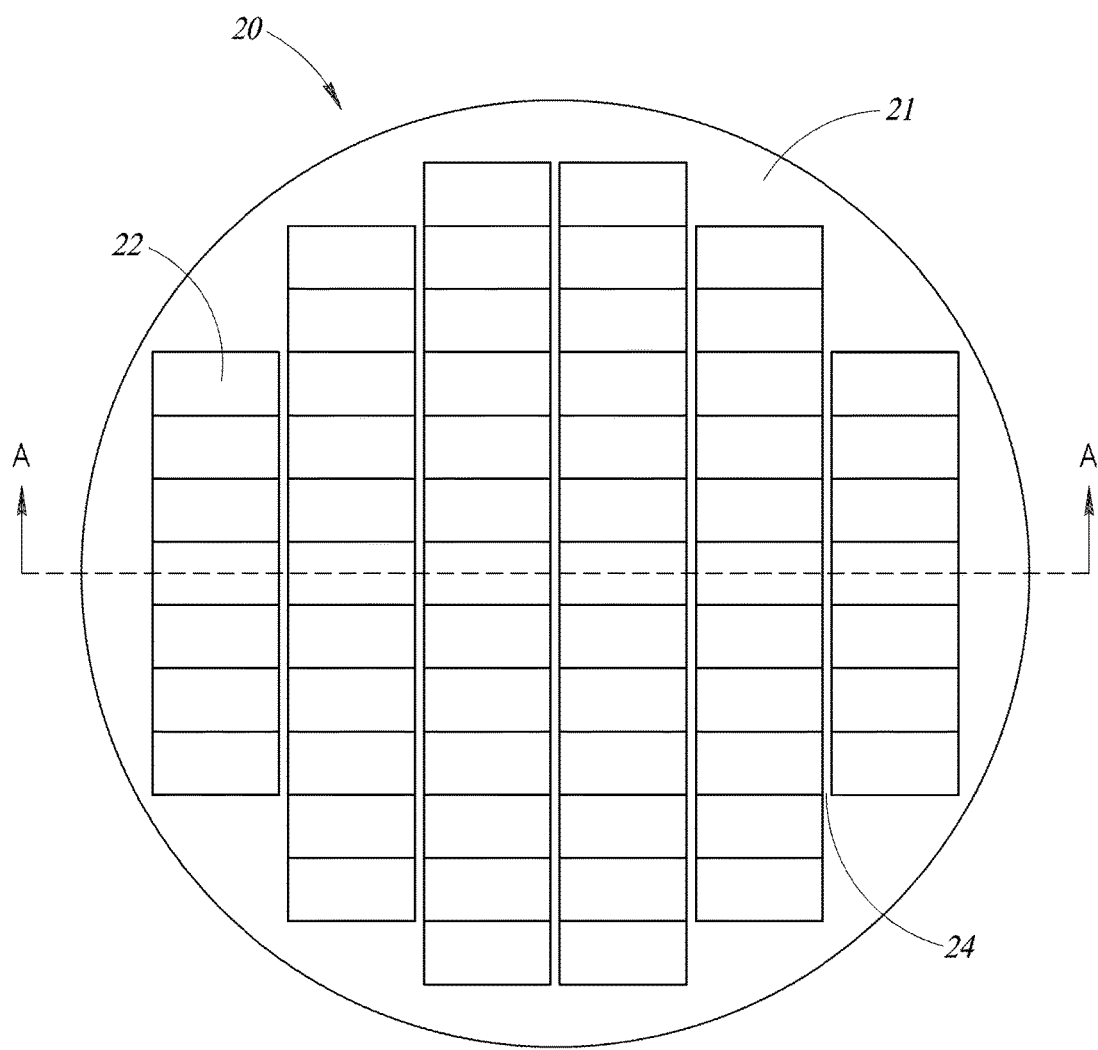
FIGS. 1-3 are views of wafer processing as is known in the prior art.
Figure 2:
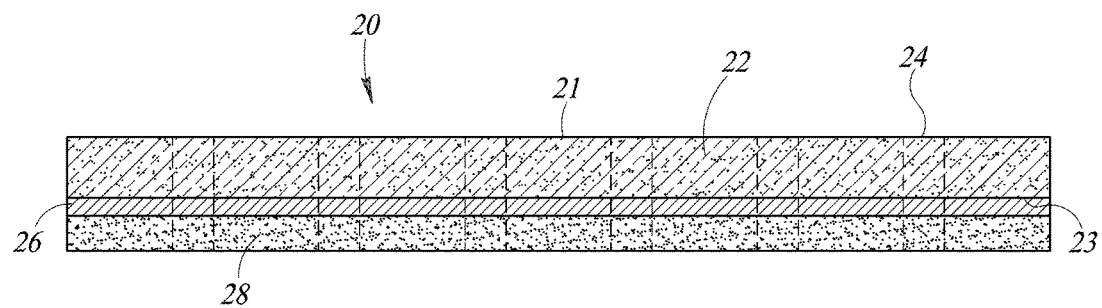
Figure 3:
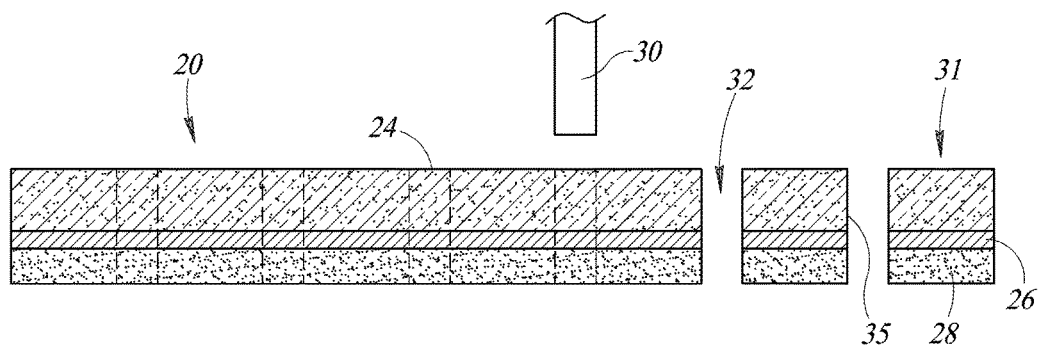
Figure 4:
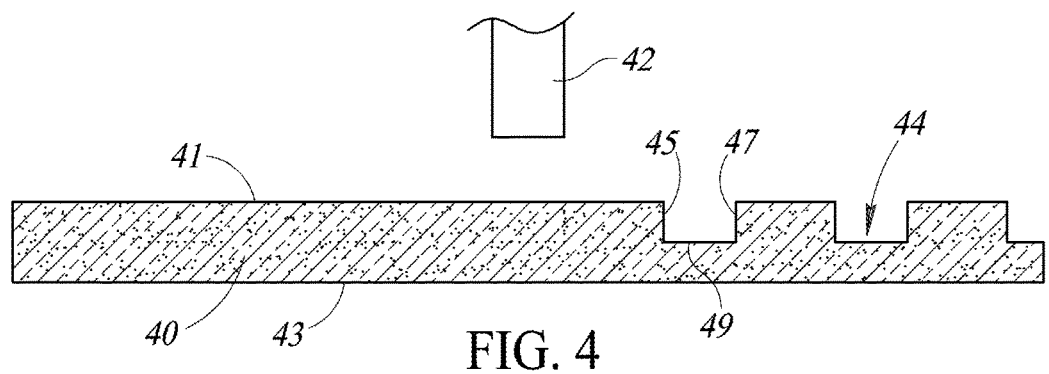
FIG. 4 is a cross-sectional view of an exemplary embodiment of wafer processing wherein a plurality of channels is formed on a wafer backside.
Figure 5:
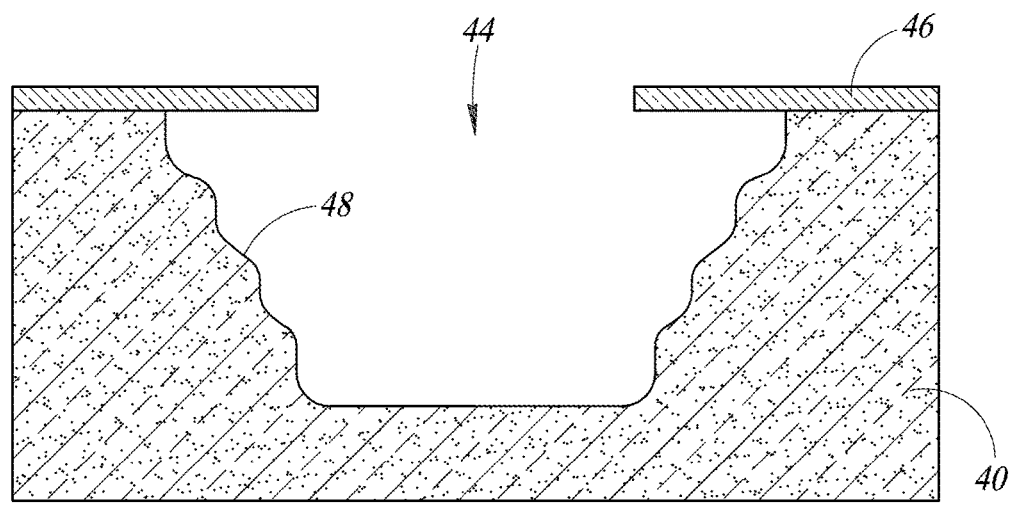
FIG. 5 is an enlarged cross-sectional view of an alternative embodiment using wafer etching to produce chamfered edges on the wafer backside.

The present disclosure is generally directed to providing a die with metallized sidewalls and a method of manufacturing the same. A first set of steps for one embodiment of processing a wafer 40 is shown in FIG. 4. In this embodiment, the wafer 40 has a backside 41 and an active side 43 opposite the backside 41. The manufacturing process begins by removing a portion of the wafer backside 41 to form a plurality of channels 44. Each channel 44 has a first wall 45, a second wall 47 and a base 49 formed by cutting the channels 44 with a mechanical saw 42. In other embodiments, forming the channels 44 can include laser cutting or etching. For example, in FIG. 5, a chamfered edge 48 is etched on walls of the channels 44. The etching process involves placing a mask 46 on the wafer 40 that identifies a portion of the wafer 40 that is to be removed. Then, an etching process is carried out (e.g., chemical, plasma, gas, etc.) to remove the portion of the wafer 40 that is not protected by the mask 46. The etching process can produce a variety of desired shapes and the mask used in the etching process may vary depending on the type of etching being performed. Once etching is complete, the mask 46 can be removed so that the manufacturing process may proceed.

Figure 6:
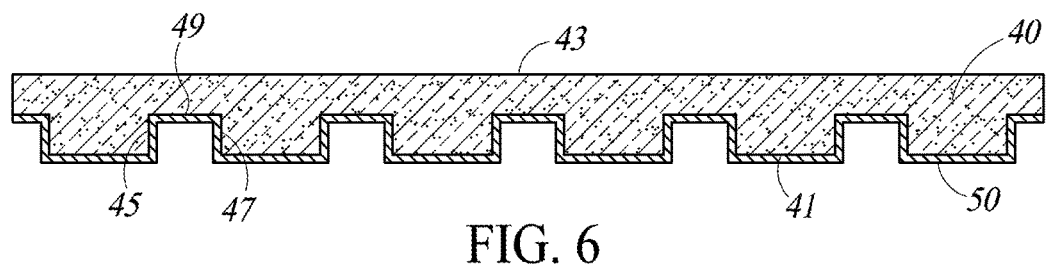
FIG. 6 is a cross-sectional view of the wafer of FIG. 4 with a contiguous metal layer applied to the wafer backside and the plurality of channels.

Once the plurality of channels 44 are formed, the backside 41 is metallized by applying a metal layer 50 to the backside 41, as shown in FIG. 6 (the wafer as shown in FIG. 6 has been inverted from the orientation shown in FIG. 4). Metallization of the wafer backside 41 is performed as a blanket, conformal deposition. Therefore, the metal layer 50 is also applied to the first wall 45, the second wall 47 and the base 49 of each of the plurality of channels 44. In other words, the metal layer 50 is contiguous and is applied to all exposed edges of the backside 41 of the wafer 40, such that the metal layer 50 is present on all sides of the backside 41 of the wafer 40.

Figure 7:
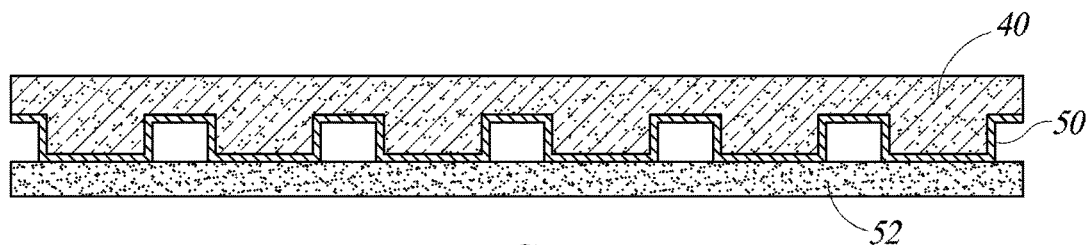
FIG. 7 is a cross-sectional view of the wafer of FIG. 6 with a wafer tape attached to the backside of the die prior to wafer processing.
Figure 8:
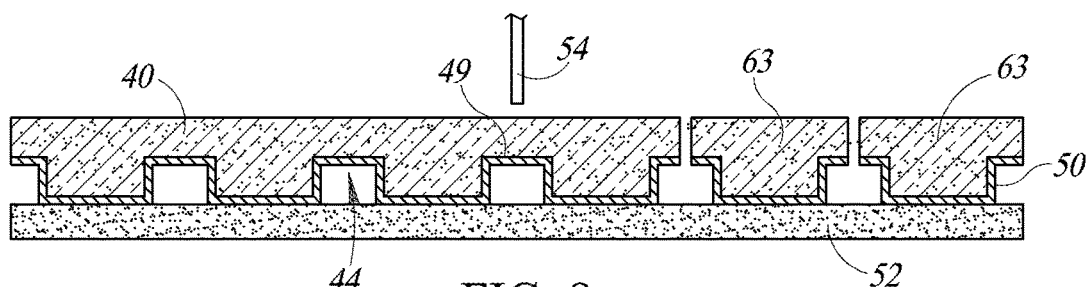
FIG. 8 is a cross-sectional view of the wafer of FIG. 7 showing a mechanical blade separating the wafer into a plurality of singulated die.

After applying the metal layer 50, a wafer tape 52 is attached to the metal layer 50 covering the backside 41 of the wafer 40, as in FIG. 7. The wafer tape 52 does not attach to the metal layer 50 covering the first wall 45, the second wall 47 and the base 49 of each of the plurality of channels 44. The wafer tape provides additional support to the wafer 40 as the wafer 40 is separated into a plurality of singulated dies 63, as shown in FIG. 8. A mechanical blade 54 cuts along scribe lines of the wafer to completely singulate each die. By following the scribe lines, the mechanical blade 54 cuts through the base 49 of each of the plurality of channels 44 and the metal layer 50 to separate the wafer 40 into the plurality of singulated dies 63. In some embodiments, the mechanical blade 54 will also cut through the wafer tape 52 in the same cutting step, although it is not necessary in other embodiments.

Figure 9:
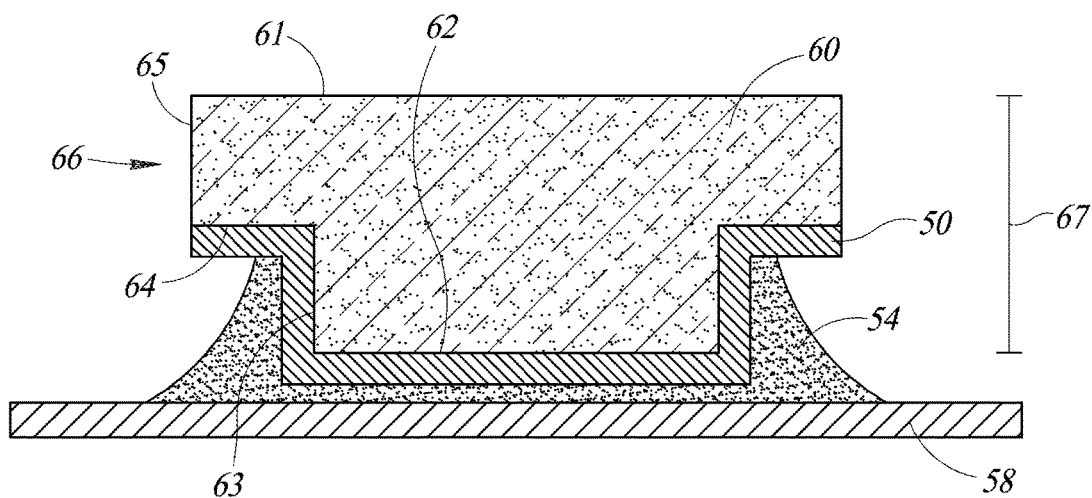
FIG. 9 is cross-sectional view of an exemplary embodiment of a singulated die having a flange that is coupled to a die pad with a sintered semiconductor glue.

FIG. 9 shows an exemplary embodiment of a singulated dies 60 with a die active side 61 and a die back side 62. In this embodiment, a sidewall 67 of the dies 60 extends from the die backside 62 to the die active side 61. The sidewall 67 has three portions: a first, vertical portion 63; a second, horizontal portion 64; and a third, vertical portion 65. The horizontal portion 64 is perpendicular to the two vertical portions 63 and 65. Cutting the base 49 of the plurality of channels 44 produces a flange 66 on each singulated dies 60. The flange 66 extends from the dies 60 adjacent to the die active side 61 and includes the second portion 64 and the third portion 65 of the sidewall 67. Metallization of the backside 41 of the wafer 40 results in the metal layer 50 covering the die backside 62, the first portion 63, and the second portion 64.

The singulated dies 60 are coupled to a die pad 58 with a sintering semiconductive glue 54. The glue 54 contains entrained metal particles that enhance the glue's electrical and thermal capabilities. When the glue is heated, or sintered, the metal particles in the glue create an intermetallic bond between the glue 54, the die pad 58 and the metal layer 50. The metal layer 50 covering the first portion 63 and the second portion 64 of the sidewall 67 allows for the intermetallic bond to form between those portions and the glue 54, which creates a bond that is not present in a die without a metal layer on the sidewall. In fact, the metal particles in the glue 54 do not form any bond with the silicon sidewall of known die 31. The additional adhesion between the glue 54 and the metal layer 50 covering the first portion 63 and the second portion 64 prevents delamination from occurring along the sides of the die 60 as the die 60 and the die pad 58 expand and contract due to the heat generated during use. Additionally, it is not necessary for the glue 54 to adhere to both the metal layer covering the first portion 63 and the metal layer 50 covering the second portion 64. Rather, any bond between the glue 54 and any portion of the metal layer 50 on the sidewall 67 of the dies 60 will result in a reduction in delamination compared to known die 31, which does not have any metal or any bonding between the sidewall and the glue.

The flange 66 also acts as a barrier that prevents adhesive creep of the glue 54 up the sidewall 67. In particular, the second portion 64 being perpendicular to the first portion 63 forces the glue 54 to turn a first corner as the glue 54 creeps up the metal layer 50 covering the sidewall 67. Similarly, the third portion 65 being perpendicular to the second portion 64 forces the glue 54 to turn a second corner in order to reach the die active side 61. As such, the cohesive forces between the glue 54 and the sidewall 67 are not strong enough to surpass both corners of the sidewall 67, which prevents the glue 54 from reaching the die active side 61.

Figure 10:
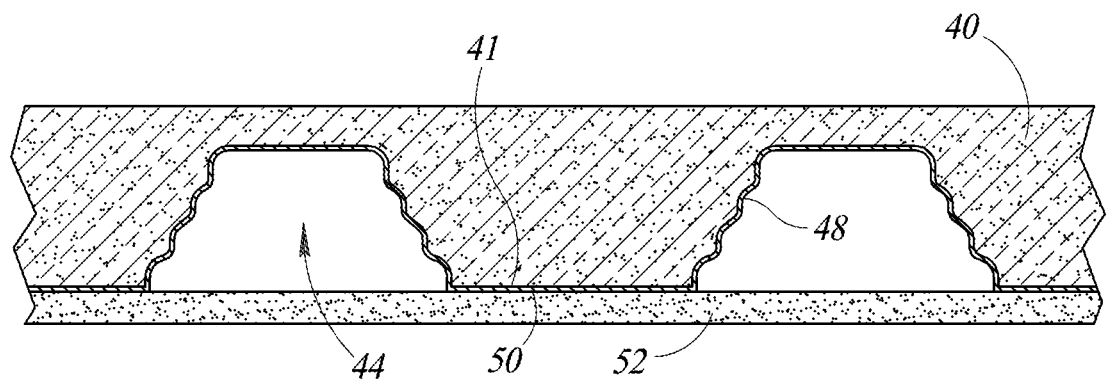
FIG. 10 is a cross-sectional view of an alternative embodiment of the wafer of FIG. 7 with chamfered edges.

In an alternative embodiment of steps for forming a die with a metallized sidewall, as in FIG. 10, the chamfered edge 48 is formed through etching to increase the surface area of the channel 44. The etching process allows for any number of possible shapes to be formed in the wafer 40 and also allows for the plurality of channels 44 to extend to any preferable distance into the backside 41 of the wafer 40. Once the chamfered edge 48 is formed and the mask 46 is removed, the metal layer 50 is applied in a blanket, conformal deposition to create a contiguous layer on each edge of the backside 41 and each chamfered edge 48. As in other embodiments, the wafer tape 52 is applied to the metal layer 50 covering a portion of the backside 41, but not the channels 44, in order to support the wafer 40 while it is cut into individual die.

Figure 11:
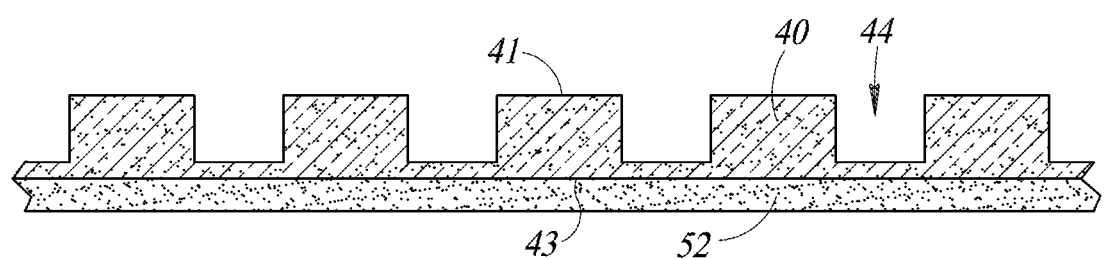
FIG. 11 is a cross-sectional view of an alternative embodiment of wafer processing wherein the wafer tape is applied to an active side of the wafer prior to forming the plurality of channels.

FIG. 11 shows an alternative exemplary embodiment of steps wherein the wafer tape 52 is applied to the active side 43 of wafer 40 before the plurality of channels 44 are formed in the backside 41 of the wafer 40. With the added support from the wafer tape 52 on the active side 43, the plurality of channels 44 can be cut deeper into the backside 41. In some embodiments, the plurality of channels 44 extends through 75 percent or more of the wafer 40, although the particular depth that is selected may vary depending on the desired characteristics of the resulting die. As in other embodiments, the wafer 40 is inverted, metallized with a blanket, conformal deposition, and separated with support from the wafer tape to form individual die.

Figure 12:
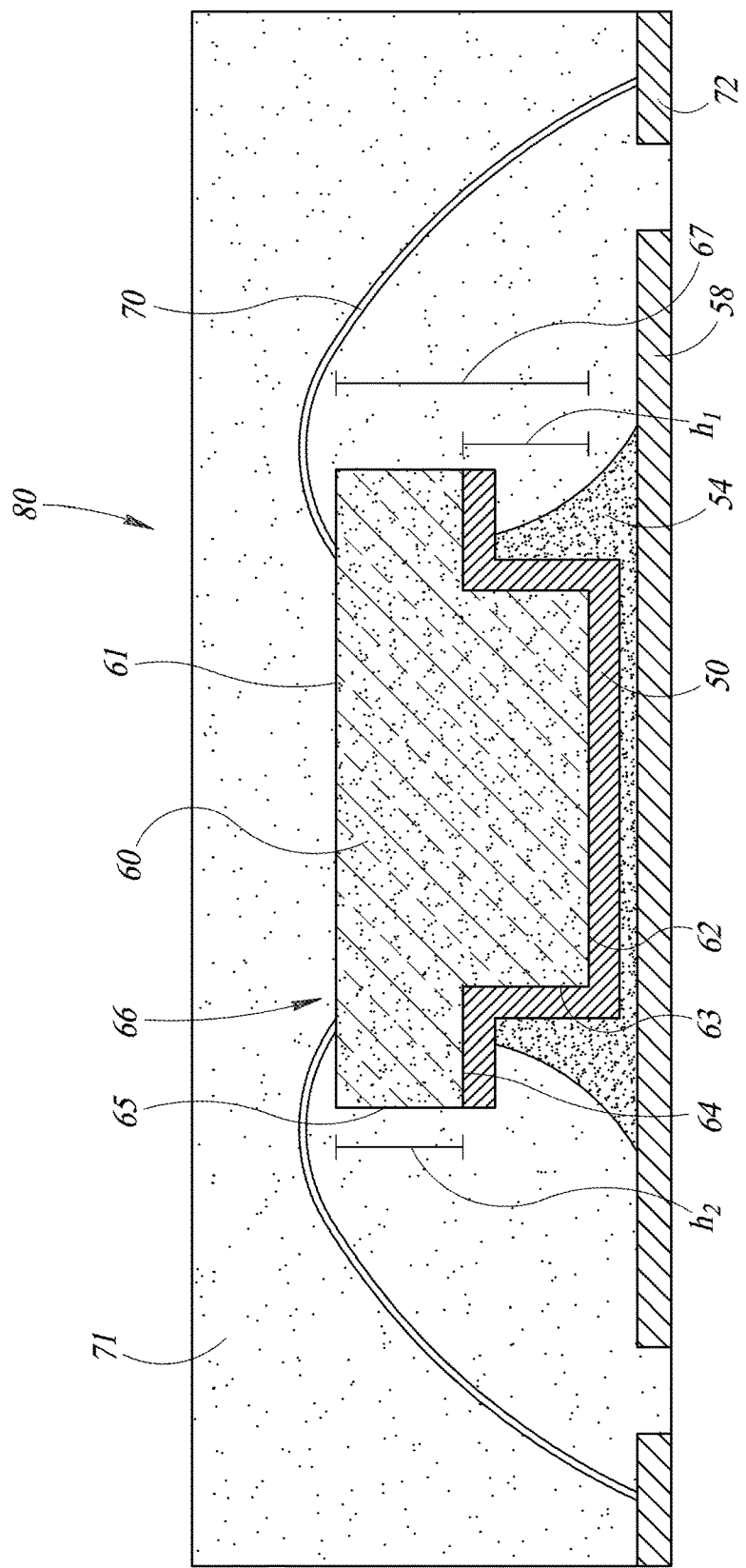
FIG. 12 is a cross-sectional view of an exemplary embodiment of a singulated die coupled to a die pad and encapsulated in a molding compound.

FIG. 12 represents an exemplary embodiment of a final series of steps in forming a semiconductor package 80. After the singulated dies 60 are coupled to the die pad 58 with the glue 54, wires 70 are attached to provide an electrical connection between the dies 60 and leads 72. The dies 60, the die pad 58 and the wires 70 are then encapsulated with a molding compound 71 to create the semiconductor package 80. The intermetallic bond formed between the glue 54 and the metal layer 50 on the first portion 63 and the second portion 64 of the sidewall 67 creates an intermediate buffer layer between the dies 60 and the package 80. This sintered layer has a thermal coefficient of expansion that is between that of the die pad 58 and the semiconductor die 60 and the molding compound 71. Generally, the die pad 58 has the highest thermal coefficient of expansion and the molding compound 71 has the lowest, with the die 60 having one that is between them. The sintered adhesion layer will have a thermal coefficient of expansion that is between that of the die 60 and of the metal, thus providing an expansion and contraction buffer between the sidewall 67 of the die 60 and the molding compound 71, with acts to further prevent the delamination process.

The dies 60 include a backside height h1 measured from the die backside 62 to the second portion 64 of the sidewall 66. The backside height h1 is therefore equal to a height of the first portion 63 of the sidewall 67. The dies 60 also have a flange height h2 measured from the die active side 61 to the second portion 64 of the sidewall 67. In other words, the flange height h2 is equal to a height of the third portion 65.

As mentioned in other embodiments, various methods of manufacturing the dies 60 allow for formation of the plurality of channels 44 to different depths in the backside 40 of the wafer 41. As such, a height of the first wall 45 and the second wall 47 of the plurality of channels 44 may vary. Once the wafer 40 is separated into individual dies 60, the variation in height of the first wall 45 and the second wall 47 results in the die 60 having differing backside height h1 and flange height h2. In some embodiments, the flange height h2 is substantially equal to the backside height h1. Yet in other embodiments, the flange height h2 is substantially less than the backside height h1, depending on the depth at which the plurality of channels 44 were formed. The flexibility to vary the flange height h2 and the backside height h1 allows for the production of die 60 with characteristics that may be more desirable in certain circumstances. For example, if additional adhesive strength is required between the glue 54 and the sidewall 67, one of skill in the art could increase the backside height h1 so that a larger portion of the sidewall 67 is covered by the metal layer 50, which will create more contact surface area and therefore more adhesive strength between the glue 54 and the metal layer 50 covering the backside height h2 of the sidewall 67.

Figure 13:
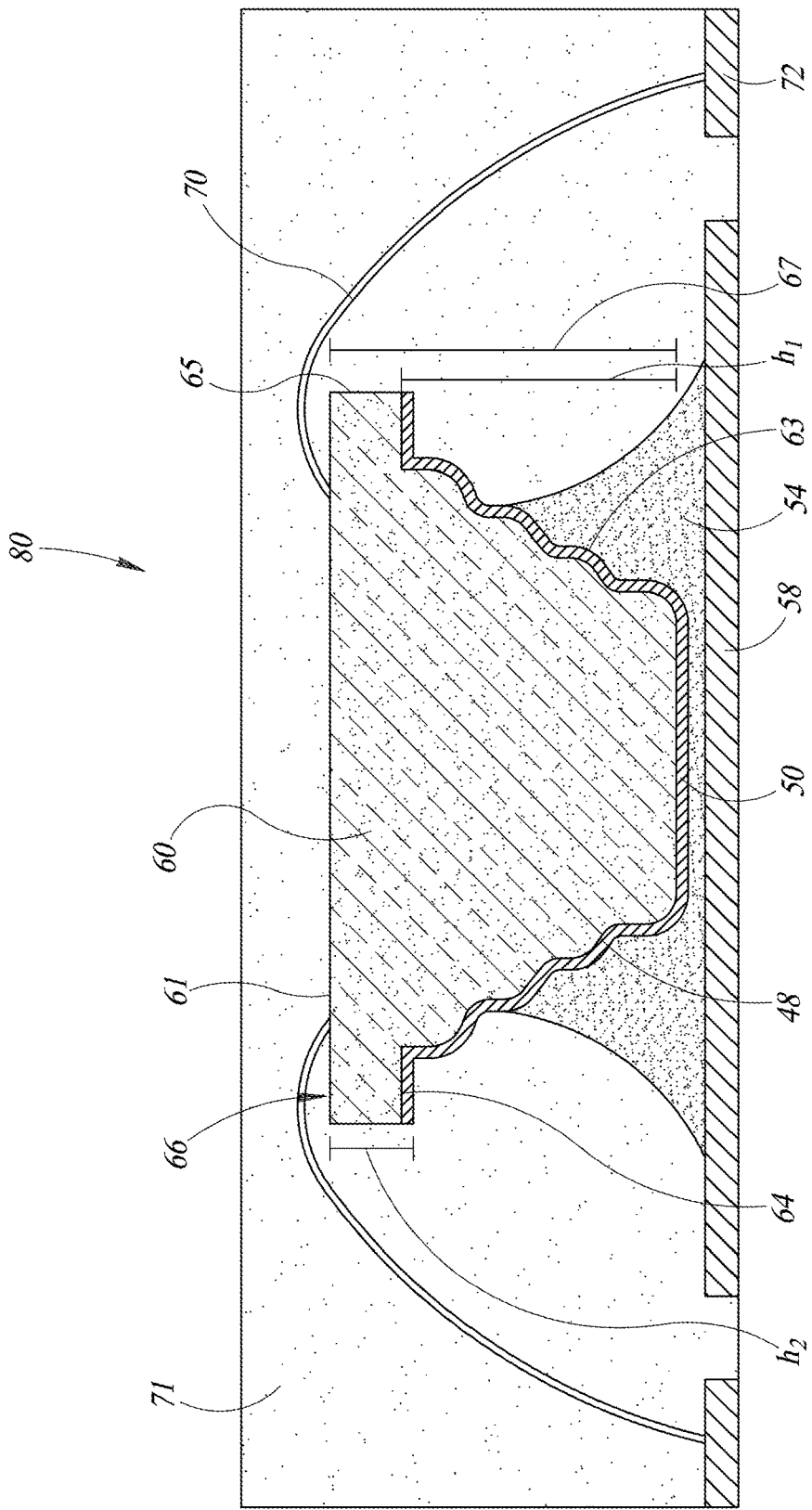
FIG. 13 is a cross-sectional view of an alternative embodiment of the die of FIG. 12 with chamfered edges.

An alternative exemplary embodiment of the semiconductor package 80 includes the die 60 with chamfered edges 48, as depicted in FIG. 13. In this embodiment, the first portion 63 of the sidewall 67 includes chamfered edges 48. Unlike other embodiments, the first portion 63 is not perpendicular to the other portions of the sidewall 67, although other embodiments formed using an etching process include the chamfered edges 48 substantially perpendicular to the other portions of the sidewall 67. In addition, etching provides the flexibility to create any suitable design or orientation of edges in the first portion 63, the second portion 64, or the third portion 65 of the sidewall 67. Instead of using a larger backside height h1 to increase adhesion, the chamfered edges 48 provide a similar effect by increasing the contact surface area between the metal layer 50 on the chamfered edges 48 and the glue 54. This increased contact surface area allows the glue 54 to develop an intermetallic bond with a larger portion of the metal layer 50 on the sidewall 67, which increases adhesive strength and further decreases the likelihood of delamination in the semiconductor package 80.

In addition, each of the edges in the chamfered edge 48 acts as a small barrier to adhesive creep. As the glue 54 attempts to creep up the metal layer 50 on the chamfered edge 48, the glue 54 is forced to surpass a series of edges or surfaces that extend successively further from the die backside 62, much like the corners of the flange 66 in other embodiments, which slows down the glue 54 and prevents it from reaching the die active side 61. Some embodiments of the die 60 with chamfered edges 48 also include the flange 66 having the third portion 65 of the sidewall 67 substantially perpendicular to the die active side 61 and the second portion 64 of the sidewall 67 substantially perpendicular to the third portion. The flange 66 with such a configuration acts as a final barrier to prevent the glue 54 from contacting the die active side 61 due to adhesive creep. In addition, the flange height h2 and the backside height h1 are customizable, as in FIG. 12, depending on the desired characteristics of the die 60.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a die pad;
 a die having a die active surface and a die backside surface opposite the die active surface, the die including:
  a plurality of sidewalls extending from the die backside surface to the die active surface, each sidewall having a first portion, a second portion and a third portion, the first portion extending from the die backside surface to the second portion, the second portion extending from the first portion to the third portion, the third portion extending from the second portion to the die active surface, the third portion being transverse to the die active surface, the first portion including a plurality of distinct curved surfaces that extend from the backside surface to the second portion;
 a flange that is closer to the die active surface than the backside surface the flange including the second portion and the third portion;
 a contiguous metal layer covering the die backside surface, the first portion, and the second portion each sidewall;
 a glue between the die backside surface and the die pad, the glue contacting the contiguous metal layer on the backside surface and the die pad.

2. The device of claim 1 wherein the second portion is substantially perpendicular to the third portion.

3. The device of claim 2 wherein the first portion is at an angle with respect to the second portion.

4. The device of claim 1 wherein the glue contacts the contiguous metal layer covering the die backside surface, and covers some of the plurality of curved surfaces of the first portion.

5. The device of claim 1 wherein the flange has a flange height from the die active surface to the second portion and the die has a backside height from the die backside surface to the second portion.

6. The device of claim 5 wherein the flange height is equal to the backside height.

7. The device of claim 5 wherein the flange height is less than the backside height.

8. A method, comprising:
 forming a plurality of channels in a backside surface of a wafer, each of the plurality of channels having a first wall, a second wall, and a base, the base being between the first wall and the second wall, the forming the plurality of channels including:
  forming a plurality of distinct curved surfaces in the first wall and the second wall of each of the plurality of channels;
 metallizing the backside surface of the wafer, the metallizing including forming a contiguous metal layer on the die backside surface, the first wall, the second wall and the base of each of the plurality of channels;
 forming a plurality of singulated die by separating the base of each of the plurality of channels, the separating including:
  forming a flange, each of the plurality of singulated die having a die active surface opposite to the base, the first wall, and the second wall, the flange being closer to the die active surface than a die backside surface, the flange including a sidewall that extends from the active surface to a portion of the backside surface, the sidewall being transverse to the active surface, the portion of the backside surface extending between the sidewall and the first wall;
 coupling the singulated die to a die pad with an adhesive that contacts the die backside surface and a portion of each first wall and each second wall.

9. The method of claim 8 further comprising:
forming the plurality of channels more than halfway through the wafer.

10. The method of claim 8 wherein forming the plurality of channels includes masking a portion of the wafer backside surface and etching the plurality of channels in the wafer backside surface.

11. The method of claim 8 wherein forming the plurality of channels includes cutting the plurality of channels with a mechanical blade.

12. The method of claim 8 wherein forming the plurality of channels includes removing material from the wafer backside surface with a laser.

13. The method of claim 8 wherein separating the base of each of the plurality of channels includes each of the singulated die having the contiguous metal layer on a portion of the first wall and the second wall of the singulated die.

14. The method of claim 13 wherein coupling the singulated die to the die pad includes sintering an adhesive that contacts the contiguous metal layer on the portion of the first wall and the second wall of the singulated die.

15. A device, comprising:
a die pad;
a die having a die active surface and a die backside surface opposite the die active resurface;
a flange closer to the die active surface than the backside surface, the flange including a portion of the die active surface;
a plurality of sidewalls extending from the die backside surface to the die active surface, each sidewall having a first portion, a second portion and a third portion, the first portion including a plurality of distinct curved surfaces, the first portion extending from the backside surface to the second portion, the second portion extending from the first portion to the third portion, the second portion being transverse to the first portion, and the third portion extending between the second portion and the die active surface, the third portion being transverse to the third portion and to the die active surface;
a contiguous metal layer covering the die backside surface, the first portion, and the second portion, the third portion being uncovered by the contiguous metal layer;
a sintering semiconductive glue coupled between the contiguous metal layer on the die backside surface and the die pad; and
a molding compound encapsulating the die and the die pad.

16. The device of claim 15 wherein each successive curved surface of the plurality of curved surfaces extends further from the die backside surface relative to a preceding curved surface of the plurality of curved surfaces.

17. The device of claim 15 further comprising the die having a flange height from the die active surface to the second portion and the die having a backside height from the die backside surface to the second portion.

18. The device of claim 17 wherein the flange height is less than the backside height.

19. The device of claim 15 wherein each of the plurality of distinct curved surfaces includes a planar portion and a curved portion.

* * * * *

UNITED STATES PATENT AND TRADEMARK OFFICE
CERTIFICATE OF CORRECTION

PATENT NO. : 10,535,588 B2
APPLICATION NO. : 15/408979
DATED : January 14, 2020
INVENTOR(S) : Rennier Rodriguez et al.

Page 1 of 1

It is certified that error appears in the above-identified patent and that said Letters Patent is hereby corrected as shown below:

In the Claims

Column 8, Lines 26-27:
"contiguous metal layer covering the die backside surface, and covers some of the plurality of curved surfaces of the"
Should read:
--contiguous metal layer covering the die backside surface and covers some of the plurality of curved surfaces of the--.

Column 9, Line 26:
"surface opposite the die active resurface;"
Should read:
--surface opposite the die active surface;--.

Signed and Sealed this
Seventh Day of April, 2020

Andrei Iancu
*Director of the United States Patent and Trademark Office*